United States Patent [19]
Bill et al.

[11] Patent Number: 5,712,815
[45] Date of Patent: Jan. 27, 1998

[54] MULTIPLE BITS PER-CELL FLASH EEPROM CAPABLE OF CONCURRENTLY PROGRAMMING AND VERIFYING MEMORY CELLS AND REFERENCE CELLS

[75] Inventors: Colin S. Bill, Cupertino; Sameer S. Haddad, San Jose, both of Calif.

[73] Assignee: Advanced Micro Devices, Inc., Sunnyvale, Calif.

[21] Appl. No.: 635,995

[22] Filed: Apr. 22, 1996

[51] Int. Cl.$^6$ ........................... G11C 16/06
[52] U.S. Cl. ............... 365/185.03; 365/185.12; 365/185.13; 365/185.2; 365/185.22; 365/185.25; 365/185.33; 365/189.09; 365/195
[58] Field of Search .............. 365/185.03, 185.12, 365/185.13, 185.2, 185.21, 185.22, 185.25, 185.33, 189.09, 195

[56] References Cited

U.S. PATENT DOCUMENTS

| | | | |
|---|---|---|---|
| 5,172,338 | 12/1992 | Mehrotra et al. | 365/185.03 |
| 5,220,531 | 6/1993 | Blyth et al. | 365/189.07 |
| 5,590,076 | 12/1996 | Haddad et al. | 365/185.25 |

Primary Examiner—David C. Nelms
Assistant Examiner—Andrew Q. Tran
Attorney, Agent, or Firm—Davis Chin

[57] ABSTRACT

An improved programming structure for performing a program operation in an array of multiple bits-per-cell flash EEPROM memory cells is provided. A memory core array (12) includes a plurality of memory cells and a reference cell array (22) having a plurality of reference core cells which are selected together with a selected memory core cell. A precharge circuit (36a) is used to precharge all of the array bit lines and the reference bit lines to a predetermined potential prior to a program operation. A reference generator circuit (134) is used for selectively generating one of a plurality of target memory core cell bit line program-verify voltages, each one corresponding to one of a plurality of programmable memory states. A switching circuit (P1,N1) is used to selectively connect a program current source to the selected certain ones of the columns of array bit lines containing the selected memory core cells which are to be programmed. A sensing logic circuit (26,27) continuously compares a potential on one of the selected bit lines and one of the plurality of target program-verify voltages. The sensing logic circuit generates a logic signal which is switched to a low logic level when the potential on the selected bit line falls below the selected one of the plurality of target program-verify voltages. The switching circuit is responsive to the low logic level for disconnecting the program current source so as to inhibit further programming of the selected memory core cells.

20 Claims, 4 Drawing Sheets

MULTIPLE BITS PER-CELL FLASH EEPROM CAPABLE OF CONCURRENTLY PROGRAMMING AND VERIFYING MEMORY CELLS AND REFERENCE CELLS

BACKGROUND OF THE INVENTION

1. Field of the Invention

This invention relates generally to floating gate memory devices such as an array of flash electrically, erasable programmable read-only memory (EEPROM) cells. More particularly, it relates to a semiconductor integrated circuit memory device having an improved programming scheme for performing a program operation in an array of two bits-per-cell flash EEPROM memory cells on a more effective and efficient basis.

2. Description of the Prior Art

As is generally known in the art, a new category of electrically erasable EPROMs/EEPROMs has emerged in recent years as an important non-volatile memory which combines the advantages of EPROM density with EEPROM electrical erasability and is sometimes referred to as "Flash" EPROM or EEPROM. In these conventional (single density) flash memory devices, a plurality of one-transistor flash EEPROM core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +12 volts applied thereto. These voltages produce "hot electrons" which are accelerated across the thin dielectric layer and onto the floating gate. This hot electron injection results in an increase of the floating gate threshold by approximately two to four volts.

In particular, the conventional programming operation is performed in small steps wherein a verify operation is employed in between the programming steps so as to read the state programmed in order to verify if the desired state has been reached. In other words, after each one of the programming steps a subsequent verify operation is performed to determine whether the programming state is correct or not. If the programming state is verified correctly, then the programming operation is terminated. For example, there is described and illustrated in U.S. Pat. No. 5,172,338 to S. Mehrotra et al. issued on Dec. 15, 1992, an EEPROM array having a plurality of memory cells which utilize this repetitive programming technique. This '338 patent is hereby incorporated by reference in its entirety. In this '338 patent, the repetitive programming is used to increase the threshold voltage of the memory cell to the desired level. Specifically, programming voltages are preferably applied in repetitive short pulses with a read operation occurring after each pulse so as to determine when the selected cell has been programmed to the desired threshold level, at which time the programming pulses are stopped.

More recently, in U.S. Pat. No. 5,220,531 to T. Blyth et al. issued on Jun. 15, 1993, there is disclosed a method and apparatus for iterative write integrated circuit analog signal recording and playback which includes an electrically alterable MOS storage device connected in a source follower configuration. This '531 patent is also hereby incorporated by reference in its entirety. The write process and circuitry provides a multi-iterative programming technique in which a first series of coarse pulses are applied to the storage cell so as to program the same to the approximate desired level. After each of the coarse pulses, the storage cell is read and compared with a signal sample desired to be written thereto. The coarse pulses are terminated when the signal read reaches a first predetermined relationship to the signal sample. Thereafter, a second series of fine pulses are applied to the storage cell so as to program the same in fine increments to a desired final programming level. Likewise, after each of the fine pulses a comparison is performed between the storage cell reading and the sample pulses. The fine pulses are terminated when the signal read reaches a second predetermined relationship to the signal sample.

The above prior art repetitive programming techniques suffer from the major disadvantage of requiring the switching between a high voltage programming mode of operation and a low voltage verify mode of operation after each programming pulse, thereby increasing the amount of time needed to complete programming. Further, since the verify or read mode is performed after each applied pulse as a separate operation, there will also be additional time consumed due to the fact that not all of the memory cells in the array will be verified to be in the correct program state at the same time.

Therefore, it would be desirable to provide an improved programming scheme for performing a program operation in an array of multiple bits-per-cell flash EEPROM memory cells which eliminates the necessity of switching between a high voltage programming mode and a low voltage verify mode. Further, it would be expedient that the verify mode of operation not be performed as a separate operation, but can be effected simultaneously or concurrently when the programming operation is in progress. The present invention represents a significant improvement over the aforementioned U.S. Pat. Nos. 5,172,338 and 5,220,531.

In co-pending application Ser. No. 08/493,138 filed Jun. 21, 1995, to Sameer S. Haddad et al. and entitled "Channel Hot-Carrier Page Write," there is disclosed a EEPROM memory which has a stacked gate cell architecture and relies upon drain-side injection of hot carriers for programming at low drain current levels, thereby permitting charge pump programming of at least 1,024 memory cells with an increased writing speed. This Ser. No. 08/493,138 is also incorporated herein by reference, which is assigned to the same assignee as the present invention. The programming circuitry of the present invention represents an implementation of the basic function of programming in a page buffer, utilizing the low current channel hot electron programming technique described in the '138 application.

SUMMARY OF THE INVENTION

Accordingly, it is a general object of the present invention to provide an improved programming method and circuitry for two bits-per-cell flash EEPROM cells which is relatively simple in its construction, easier to manufacture, and has an increased writing speed over the prior art programming techniques.

It is an object of the present invention to provide a semiconductor integrated circuit memory device having an improved programming scheme for performing a program operation in an array of two bits-per-cell EEPROM memory cells on a more effective and efficient basis.

It is another object of the present invention to provide an improved programming method for two bits-per-cell flash EEPROM memory cells which utilizes hot carrier injection of electrons for programming at low drain current levels.

It is still another object of the present invention to provide an improved programming method and circuitry for two bits-per-cell flash EEPROM memory cells in which the reference core cells are programmed at the same time as the selected memory array core cells are being programmed, thereby minimizing mismatches therebetween.

It is yet still another object of the present invention to provide an improved programming method and circuitry for programming two bits-per-cell flash EEPROM memory cells and for concurrently verifying the programmable threshold voltage levels in the selected memory cells during programming.

In accordance with a preferred embodiment of the present invention, there is provided an improved programming structure for performing a programming operation in an array of multiple bits-per-cell flash EEPROM memory cells on a more effective and efficient basis. A memory core array includes a plurality of memory cells arranged in rows of word lines and columns of bit lines intersecting the rows of word lines. Each of the memory cells includes a floating gate array transistor. A row decoder is responsive to row address signals and is operatively connected to the memory core array for selecting certain ones of the rows of word lines. A column decoder is responsive to column address signals and is operatively connected to the memory core array for selecting certain ones of the columns of bit lines. A reference cell array includes a plurality of reference core cells arranged in rows of word lines corresponding to the number of rows in the memory core array and in columns of reference bit lines corresponding to the number of programmable memory states and which are selected together with selected memory array core cells. A precharging circuit is provided for initially precharging all of the array bit lines and all of the reference bit lines to a predetermined level prior to a programming operation.

A reference voltage generator is provided for selectively generating at its output one of a plurality of target memory core cell bit line program-verify voltages, each one corresponding to one of a plurality of programmable memory states. A switching circuit is provided for selectively connecting a program current source to the selected certain ones of the columns of array bit lines containing the selected memory core cells which are to be programmed. A sensing logic circuit has a first input connected to the output of the reference voltage generator circuit and has a second input connected to the selected certain ones of the columns of array bit lines for continuously comparing a potential on one of the selected bit lines and one of the plurality of target program-verify voltages generated by the reference voltage generator circuit.

The sensing logic circuit has an output for generating a logic signal which is switched to a low logic level when the potential on the selected bit line falls below the selected one of the plurality of target reference program-verify voltages. The switching circuit is responsive to the low logic level for disconnecting the program current source so as to inhibit further programming of the selected memory core cells. A second reference voltage generator, a second switching circuit, and a second sensing logic circuit are provided so as to program each one of the plurality of reference core cells to a corresponding one of a plurality of target reference cell voltages at the same time as the memory core cells are being programmed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

An improved program structure for performing a programming operation in an array of two bits-per-cell flash EEPROM memory cells is described. In the following description, numerous specific details are set forth, such as specific circuit configurations, components, and the like in order to provide a thorough understanding of the present invention. However, it should be apparent to those skilled in the art that the present invention may be practiced without these specific details. In other instances, well-known processes, circuits, and control lines, not particularly relevant to the understanding of the operating principles of the present invention, have been purposely omitted for the sake of clarity.

Figure 1:
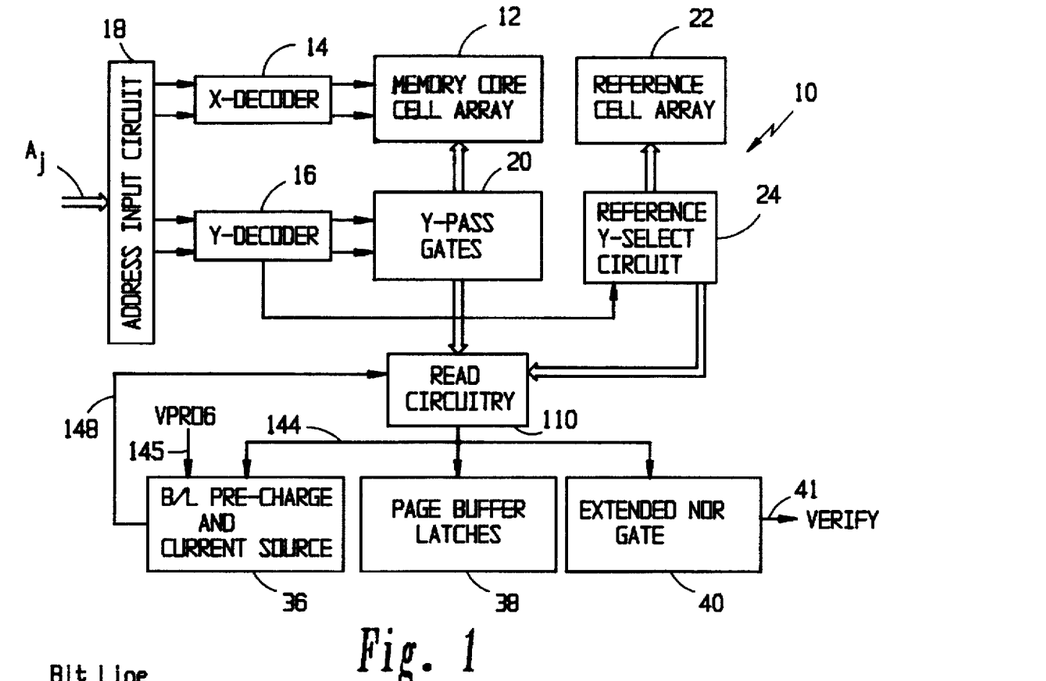
FIG. 1 is a block diagram of a two bits-per-cell semiconductor integrated circuit memory device having improved programming circuitry 36, constructed in accordance with the principles of the present invention.

Referring now in detail to the drawings, there is shown in FIG. 1 a block diagram of a two bits-per-cell semiconductor integrated circuit memory device 10 which includes an improved programming circuitry of the present invention for performing a programming operation in an array of two bits-per-cell flash electrically erasable read-only memory (EEPROM) cells of the memory device on a more effective and efficient basis. The improved programming circuitry and the remaining portions of the memory device 10 are both wholly formed on a single semiconductor substrate by known CMOS integrated circuit technology.

The two bits-per-cell semiconductor integrated circuit memory device 10 includes a memory core cell array 12, a row address decoder 14, a column address decoder 16, an address input circuit 18, a Y-pass gate circuit 20, a reference cell array 22, and a reference Y-select circuit 24. The memory core cell array 12 includes approximately 16 million core cells arranged in a regular matrix pattern of $2^{12}$ rows and $2^{12}$ columns. Preferably, groups of columns are formed such that each group defines a page. Each page represents a number of bytes of data. For instance, the $2^{12}$ columns may be divided into four pages so that each page will contain 128 bytes (1024 bits) of data. Further, a predetermined number of rows may be grouped together so as to form a sector defining a selectable block. For example, the $2^{12}$ rows may be divided into 64 sectors so that each sector will be composed of 64 rows. Thus, each sector will consist of 256K cells, corresponding to 512K bits of data stored with two bits-per-cell. For the two bits-per-cell memory device 10, the 16 Mb flash memory cells can actually store 32 Mb of data since two bits of data per cell is being stored in order to provide a double density storing capacity.

Figure 2:
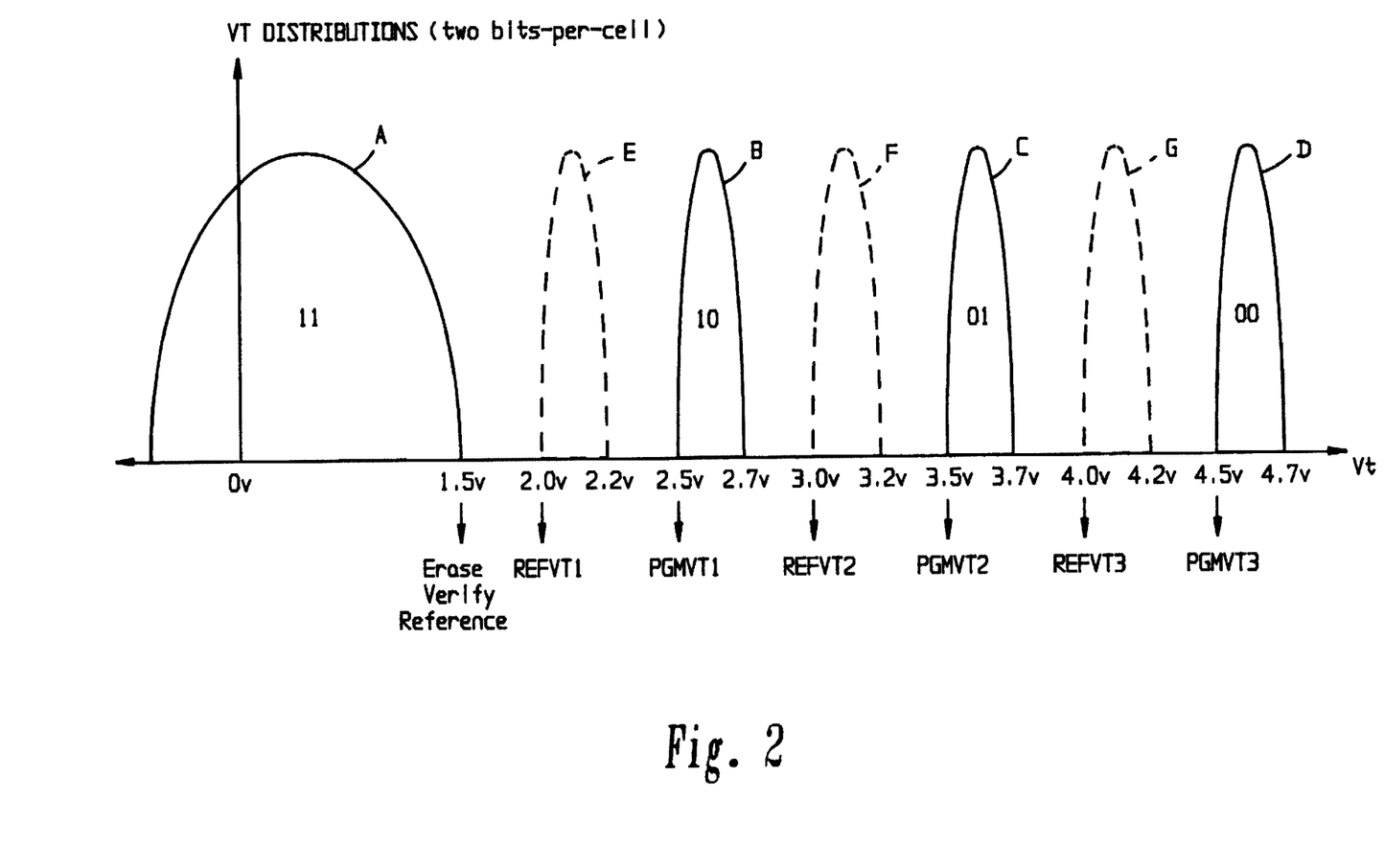
FIG. 2 is a graph of four memory states for a cell storing two bits-per-cell and the corresponding threshold voltage distributions for the three reference cells disposed therebetween.

By a programming operation via a bit line pre-charge circuitry and program current source circuitry 36 of the present invention, each of the memory core cells has its threshold voltage set to one of three higher levels with respect to its control gate than a memory core cell which is not programmed but set in the erased state. In FIG. 2, there is shown a graph of four threshold voltage $V_t$ distributions for the four possible states (three programmed states and an erased state) for the double density memory cells. As can be seen, the curve A shows the threshold voltage distribution for the memory core cells in the erased state or corresponding to storing data or logic "11." The erased verify reference voltage (ERR) of the erased state is from +1.5 V to below 0 V. The curve B shows the voltage distribution for the memory core cells in the first programmed state (PGMVT1) or corresponds to storing data or logic "10." The voltage PGMVT1 of the first programmed state is in the range between +2.5 V to +2.7 V. Similarly, the curve C shows the threshold voltage distribution for the memory core cells in the second programmed state (PGMVT2) or corresponding to storing data or logic "01." The voltage PGMVT2 of the second programmed state is in the range between +3.5 V to +3.7 V. Finally, the curve D shows the threshold voltage distribution for memory core cells in the third programmed state (PGMVT3) or corresponding to storing data or logic "00." The voltage PGMVT3 of the third programmed state is in the range between +4.5 V to 4.7 V.

The reference cell array 22 includes a plurality of sets of reference columns. Each column in the sets of reference columns has $2^{12}$ rows corresponding to the number of rows in the memory core cell array 12. Thus, there will be $2^{12}$ rows in each of the sets of reference columns. Further, the number of the plurality of sets of reference columns corresponds to the number of possible programmed memory states of the memory core cell. For the two bits-per-cell state memory device 10, there will be three sets of reference columns. In addition, the three sets of reference columns are embedded and are associated with every page in the memory core array 12 with dedicated bit lines so that the reference column cells can be programmed and erased along with the remainder of the selected page. In particular, when the page is being programmed, 128 bytes are usually programmed in parallel. Therefore, three reference columns of reference core cells are also concurrently programmed when the memory core cells are being programmed.

Similarly, three threshold voltages for the reference columns are required to be set at intermediate states between adjacent memory states. As shown in FIG. 2, the curve E shows the threshold voltage distribution for the first reference level (REFVT1) in the first reference column. The voltages REFVT1 of the first reference level is in the range between +2.0 V to +2.2 V. Similarly, the curve F shows the threshold voltage distribution for the second reference level (REFVT2) in the second reference column. The voltages REFVT2 of the second reference level is in the range between +3.0 V to 3.2 V. Finally, the curve G shows the threshold voltage distribution for the third reference level (REFVT3) in the third reference column. The voltages REFVT3 of the third reference level is in the range between +4.0 V to 4.2 V.

As a result, the memory cell has the capability of storing two bits of data depending upon the value of the memory core threshold voltages. Likewise, the reference core cells has a reference level dependent upon the value of the reference threshold voltage. As will be noted, the threshold voltages for the respective curves A through D for each of the memory core cells of the two bits-per-cell flash memory device are not all identical to the threshold voltages on all other memory cells but varies in a typical Gausian or bell-shaped distribution. Likewise, the respective curves E through G are also in the form of a bell-shaped curve.

Address signals $A_j$ are externally applied to the address input circuit 18. The row address signals from the address input circuit 18 are fed to the row address decoder 14, and the column address signals thereof are fed to the column address decoder 16. The row address decoder 14 selects certain ones of the plurality of word lines in the memory core cell array 12 in response to the row address signals. The column address decoder 16 selects one of the pages in the memory core array in response to the column address signals as well as the corresponding sets of reference columns associated with the selected page. During the programming operation, the Y-pass gate circuit 20 connects all of the array bit lines in the selected page with a read circuitry 110 and the programming current source circuit 36. The reference column select circuit 24 connects all of the corresponding reference bit lines of the reference cell array associated with the selected page to the read circuitry 110 and to the programming current source circuitry 36.

Figure 3:
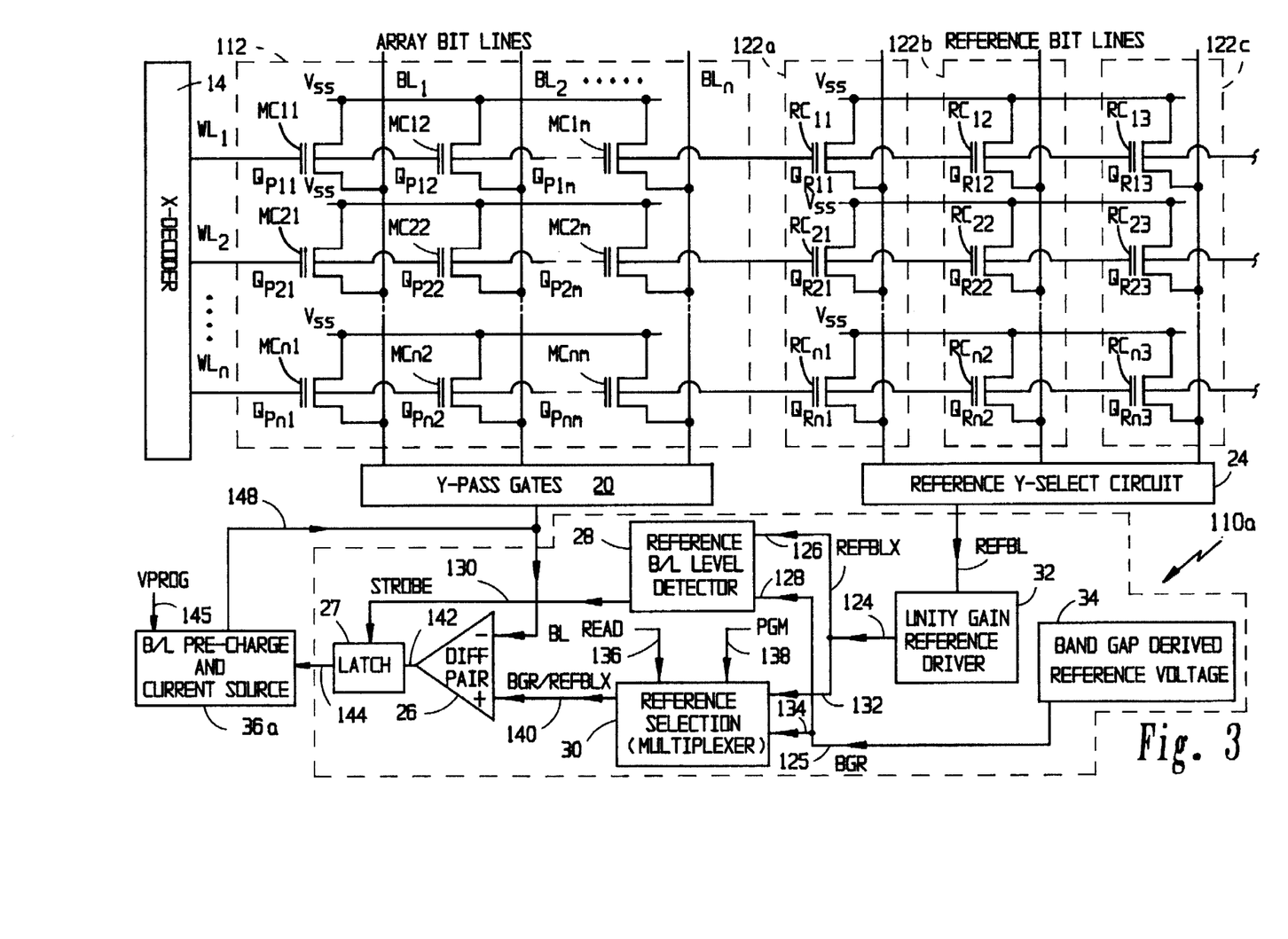
FIG. 3 is a simplified block diagram of the programming circuit 36 and associated read circuitry 110 of FIG. 1.

In FIG. 3, there is illustrated a simplified block diagram of a portion of the program current source circuitry 36a and a portion of the read circuitry 110a in FIG. 1 for use with one page (i.e., $WL_1$ of array 112) of the memory core array 12 with associated reference columns 122a, 122b and 122c of the reference cell array 22. As can be seen, the memory core cells MC11 through MCnm of the array 112 are arranged in the form of a matrix. The core cells MC11, MC12, . . . MC1m are arranged in the same row and have their selection terminals connected to the same common word line $WL_1$. Similarly, the memory core cells MC21, MC22, . . . MC2m are arranged in the same row and have their selection terminals connected to the common word line $WL_2$. This is likewise done for each of the remaining rows in the block 112. Finally, the memory core cells MCn1, MCn2, . . . MCnm are arranged in the same row and have their selection terminals connected to the common word line WLn. Also, the core cells MC11, MC21, . . . MCn1; the core cells MC12, MC22, . . . MCn2; . . . and the core cells MC1m, MC2m, . . . MCnm are arranged in the same respective columns and have their corresponding data terminals connected to associated common bit lines $BL_1$, $BL_2$, . . . $BL_n$, respectively. The number n is equal to 64 for a sector, and the number m is equal to 1024 for a page containing 256 bytes of two bits-per-cell data.

Each of the memory core cells MC11 through MCnm is comprised of one of the corresponding array floating gate transistors $Q_{p11}$–$Q_{pnm}$. The array transistors $Q_{p11}$–$Q_{pnm}$ function as a memory transistor for storing data or logic levels "11," "10," "01," or "00" therein. Each of the array transistors has its gate connected to one of the rows of word lines, its source connected to one of the columns of bit lines, and its drain connected to a page common array ground line VSS.

The reference column 122a is comprised of a plurality of reference cells $RC_{11}$, $RC_{21}$, ... $RC_{n1}$. Each of the reference cells $RC_{11}$–$RC_{n1}$ is comprised of one of the corresponding reference cell transistors $Q_{R11}$–$Q_{Rn1}$. Similarly, the reference column 122b is comprised of a plurality of reference cells $RC_{12}$, $RC_{22}$, ... $RC_{n2}$. Each of the reference cells $RC_{12}$–$RC_{n2}$ is comprised of one of the corresponding reference cell transistors $Q_{R12}$–$Q_{Rn2}$. Finally, the reference column 122c is comprised of a plurality of reference cells $RC_{13}$, $RC_{23}$, ... $RC_{n3}$. Each of the reference cells $RC_{13}$–$RC_{n3}$ is comprised of one of the corresponding reference cell transistors $Q_{R13}$–$Q_{Rn3}$. The gates of the array transistors and the reference cell transistors located in the same row in the page are connected to the same word line. For example, the gates of the array transistors $Q_{P11}$, $Q_{P12}$, ... $Q_{P1m}$ and the gates of the reference cell transistors $Q_{R11}$, $Q_{R12}$, and $Q_{R13}$ are connected to the word line $WL_1$.

During the page mode programming of the two bits-per-cell memory core array 12, three reference cell transistors in the same row associated with the memory array core cells being programmed are also concurrently programmed. Thus, each of the three reference cell transistors is programmed to a different reference threshold level, each being programmed to have a reference level between two of the adjacent actual program states of the array core cell. With reference again to FIG. 2, it can be seen that a first reference core cell is concurrently programmed to a first reference level REFVT1 (curve E) located between the program logic level "10" and the erased logic level "11." Similarly, a second reference core cell is concurrently programmed to a reference voltage level REFVT2 (curve F) located between the program logic levels "01" and "10." Finally, a third reference core cell is concurrently programmed to a reference voltage level REFVT3 located between the program levels "00" and "01."

The read circuitry 110a includes a differential pair amplifier 26, a latch 27, a reference bit line level detector 28, a reference selection circuit 30, a unity gain reference driver 32, and a bandgap reference generator 34. As can be seen, the unity gain reference driver 32 has its input connected to a common reference bit line REFBL and has its output on line 124 for providing a reference bit line voltage REFBLX. Since the resistance and capacitance of the array bit lines and the reference bit lines are closely matched, the unity gain reference driver 32 serves to buffer the reference bit line and supplies a 1-to-1 voltage translation with minimal phase lag to the differential pair amplifier 26. During programming, the bandgap generator 34 is used to produce selectively one of a plurality of very stable badgap reference derived voltages BGR on line 125, each one related to one of the target reference program-verify voltages PGM1–PGM3 in FIG. 4.

For example, for the first programmed state the required threshold voltage distribution is shown in the curve B of FIG. 2. The lowest threshold level for the first programmed state is PGMVT1 or +2.5 V. This corresponds to a target final bit line program-verify voltage PGM1 illustrated in FIG. 4 during the first programming phase. The bandgap reference derived voltage BGR on the line 125 of FIG. 3 is set by the reference generator 34 to this voltage PGM1 in the first programming phase. Similarly, the bandgap reference derived voltage BGR on the line 125 will be set to the voltage PGM2 or PGM3 in the respective second and third programming phases, which correspond to the threshold levels for the second programmed state PGMVT2 and the third program state PGMVT3 of FIG. 2.

During programming, the program enable signal PGM on line 138 is active and will cause the reference selection circuit 30 to deliver the bandgap reference derived voltage BGR on its input to its output on line 140. The differential pair amplifier 26 functioning as a comparator has its non-inverting input connected to receive the bandgap reference derived voltage BGR and its inverting input connected to receive the array bit line voltage BL. The differential amplifier 26 consists of a sense amplifier and has its output driving the latch 27. At the time of programming, the verify mode of operation is being performed concurrently or simultaneously. Thus, the differential pair amplifier 26 is used to monitor the voltage on the bit line BL as the program operation progresses.

Figure 4:
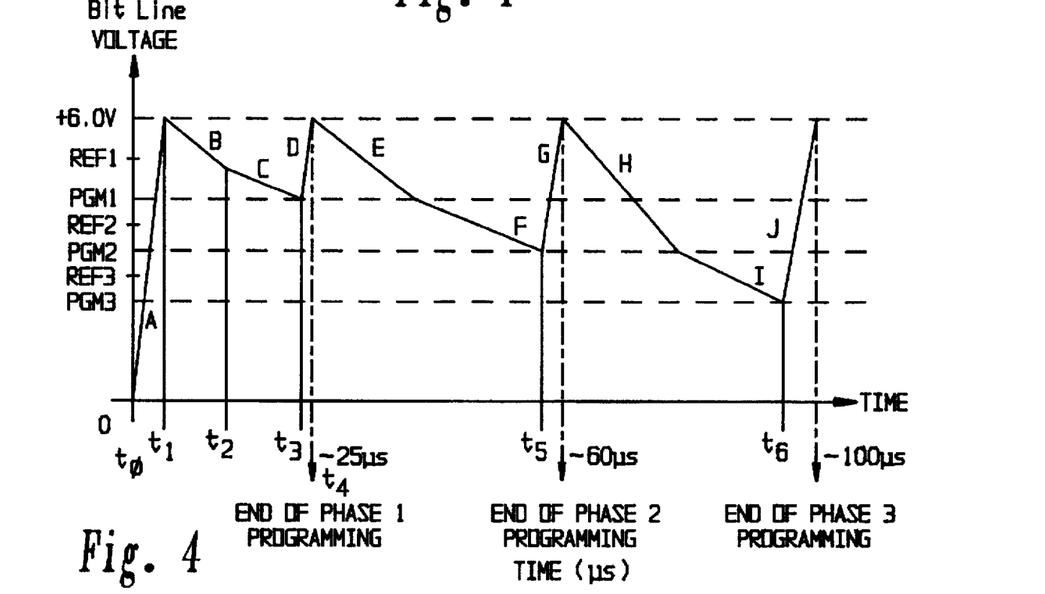
FIG. 4 is a graph of the bit line voltage as a function of the programming time corresponding to the three programmed states B, C, and D of FIG. 2, useful in understanding the programming operation of the present invention.

If the voltage on the selected bit line connected to the memory cell to be programmed is greater than the bandgap reference derived voltage BGR corresponding to one of the target final bit line program-verify voltages (i.e., PGM1, PGM2 or PGM3) in FIG. 4, the output of the differential pair amplifier 26 on line 142 will be low and the latch 27 will store a logic "1" on its output terminal on line 144. In response to this logic "1," the program current source circuitry 36a will maintain a current of approximately 5 µA to flow in the bit line. When the voltage on the bit line BL is less than the bandgap reference derived voltage BGR, the output of the differential pair amplifier 26 will be switched high and the logic will store a logic "0" on its output. In response to this logic "0," the program current source circuitry 36a will cause the current source to be turned off and the program inhibit high voltage VPROG on line 145 will be connected to the bit line so as to inhibit further programming.

Figure 5:
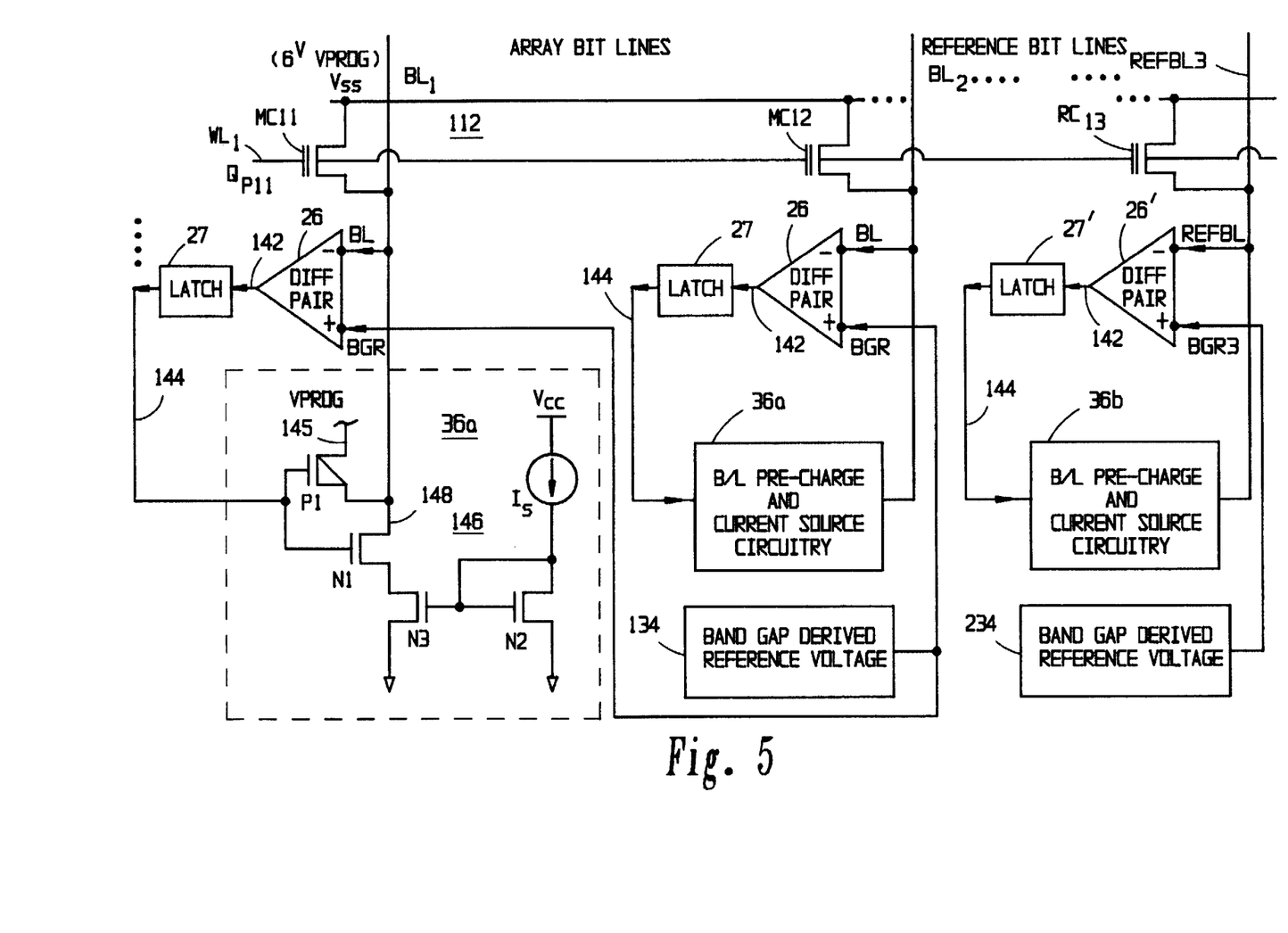
FIG. 5 is a schematic circuit diagram of the programming circuitry 36a associated with individual bit lines of a multiple page buffer containing the selected memory core cell desired to be programmed in the memory array portion 112 of FIG. 3.

In FIG. 5, there is illustrated a schematic circuit diagram of a portion of the program current source circuitry 36a in FIG. 3 for use with one array bit line $BL_1$ within the page (i.e., $WL_1$ of array 112) of the memory core array 12 and with one reference bit line REFBL3 of the associated reference column 122c. The program current source circuitry 36a is comprised of a transistor switch N1, a pull-up transistor P1, and a current mirror arrangement 146. The transistor switch N1 has its drain connected to the array bit line $BL_1$ via line 148 defining the output of the program current source circuitry 36a and its gate connected to the gate of the pull-up transistor P1. The pull-up transistor P1 has its source connected to the program inhibit high voltage VPROG via the line 145, which is approximately +5 V to +6 V, and has its drain connected also to the output line 148.

The current mirror arrangement 146 consists of a current source $I_S$ for producing a current sink of approximately 5 µA and a pair of mirror transistors N2 and N3. The current source $I_S$ has its one end connected to a power supply potential VCC, which is approximately +3 V, and has its other end connected to the drain and gate of the transistor N2. The gate of the transistor N2 is also connected to the gate of the transistor N3. The sources of the transistors N2 and N3 are connected to a ground potential. The drain of the transistor N3 is connected to the source of the transistor switch N1.

The novel programming and concurrent verify method of the present invention for the multiple bits-per-cell memory array 112 of FIG. 3 will now be explained in detail with reference to FIGS. 4 and 5. For the sake of simplicity and the purposes of illustration, it will be assumed that it is desired to program the memory core cell $MC_{11}$ to the third target program level or state PGMVT3 (logic "00") as shown in FIG. 2. Thus, the level of the bandgap reference derived voltage BGR from the reference generator 134 will be preset at PGM3 corresponding to the final bit line voltage of the third target program state PGMVT3. Further, in order to minimize the effects of mismatches between the memory core cells and the reference core cells as well as to improve the tracking of the threshold voltages therein, the reference cells are programmed simultaneously with the programming of the selected memory cells.

Accordingly, the reference core cells $RC_{11}$, $RC_{12}$, and $RC_{13}$ are programmed concurrently as the memory core cell $MC_{11}$ is being programmed, to their respective target reference cell voltages REFVT1, REFVT2, and REFVT3 as shown in FIG. 2. It will be noted that only the reference cell $RC_{13}$ and the associated program current source control source circuitry 36b are shown in FIG. 5. Therefore, the level of the bandgap reference derived voltage BGR3 from the corresponding reference generator 234 will be set at approximately REF3 corresponding to the final bit line program-verify voltage of the third target reference cell threshold voltage REFVT3.

It should be clearly understood that the level of the bandgap reference derived voltage BGR from the reference generator 134 must be selectively set to provide one of the three target final bit line program-verify voltages of PGM1, PGM2, and PGM3 in order to program the selected memory cell $MC_{11}$ to one of the three program states. Likewise, the levels of the bandgap voltages BGR1–BGR3 from the reference generator 234 must be settable to further provide the corresponding target reference cell final bit line program-verify voltages of REF1, REF2 and REF3 in order to program the associated reference cells $RC_{11}$, $RC_{12}$ and $RC_{13}$ to the respective reference voltage levels. Further, the bit line pre-charging circuit portion of the circuitry 36a is used to initially pre-charge all of the array bit lines and the common array ground line VSS to the program voltage VPROG, which is approximately +5 V to 6 V.

For the present example, the bit line $BL_1$ is thus pre-charged to +6.0 V between times t0 and t1 along the curve A in FIG. 4. Then, only the current source $I_S$ connected to the bit line having a memory core cell that is required to be programmed will be switched on. Therefore, the voltage on the bit line $BL_1$ will initially discharge its associated capacitance along curve B in FIG. 4 until a sufficient drain-to-source voltage $V_{DS}$ is created across the core transistor $Q_{P11}$ being programmed, such as at time t2. The current of 5 μA flowing in the current sink transistor N3 will maintain the potential on the bit line $BL_1$ at a threshold voltage below the floating gate potential. In other words, the bit line voltage is approximately 1 threshold voltage $V_t$ drop below the poly-1 potential in the floating gate transistor $Q_{P11}$ less a small delta voltage which allows the channel current to flow.

As the voltage on the bit line continues to fall along curve C the differential pair amplifier 26 continuously compares this bit line voltage (corresponding to the threshold voltage of the memory cell $MC_{11}$ being programmed) with respect to the bandgap reference derived voltage BGR (corresponding to the third target program state PGMVT3). It should be noted that during the programming mode the floating gate of the memory cell transistor is being charged with electrons and thus its potential is becoming more negative. However, the threshold voltage seen at the control gate is being made more positive.

If the bandgap reference derived voltage BGR from the reference generator 134 had been set to PGM1 corresponding to the first target reference program voltage PGMVT1, then the voltage on the bit line $BL_1$ will be more than the bandgap reference derived voltage BGR from the time t2 until the time t3. Thus, the output of the differential amplifier pair 26 will be low and a logic "1" will be stored in the latch 27. This maintains the current source $I_S$ turned on and thus programming continues. However, at the time t3, the voltage on the bit line $BL_1$ will be less than the bandgap reference derived voltage BGR. This will cause the output of the differential amplifier pair 26 to be changed to a high state and a logic "0" will be stored in the latch 27. As a result, the pull-up transistor P1 will be turned on, which applies the program inhibit high voltage VPROG to the bit line $BL_1$, so as to inhibit further programming at time t4. This is also the point of verify. Accordingly, unlike the prior art, there is no separate operation to be performed for verifying the programmed level.

On the other hand, if the reference bandgap voltage BGR from the reference generator 134 has been set to PGM2 corresponding to the second target reference program PGMVT2, the above process would be repeated along the curve F until time t5. However, since the bandgap reference derived voltage BGR from the reference generator 134 had been set to the third target reference program voltage of PGM3 corresponding to the third program level PGMVT3, this above process will be repeated again and the programming will continue along the curve I until time t6. As can be seen, the programming of the memory cell to the third target program state PGMVT3 is accomplished in approximately 100 uS. It should be noted that there is required one current source for each memory core cell and since one page (1,024 bits) is programmed at one time, there will be required a total current of approximately 5 mA.

The information from the latch 27 is then later clocked into the shift register of a page buffer 38. An extended NOR gate circuit 40 is used for generating a signal VERIFY on line 41 which goes to a high logic level when the whole page has been verified. The details of the circuits and operations thereof for the page buffer 38 and the NOR gate circuit 40 are described and illustrated in co-pending U.S. application Ser. No. 08/669,116 filed Jun. 24, 1996 and entitled "A Multiple Bits-Per-Cell FLASH Shift Register Page Buffer" which is assigned to the same assignee as the present invention.

This same programming operation is used to program the reference cells $RC_{11}$–$RC_{13}$ to their respective target reference voltage levels REFVT1, REFVT2, and REFVT3 at the same time as the memory core cell $MC_{11}$ is being programmed. Since the programming operation for these reference cells $RC_{11}$–$RC_{13}$ is identical to that described with respect to the memory core cell $MC_{11}$, it will not be repeated herein again.

It should be apparent to those skilled in the art that the improved programming current source circuitry 36 of the present invention, while described with respect to a two bits-per-cell memory core array, is equally applicable to multiple bits-per-cell memory core arrays storing more than two bits of data. In particular, each of the memory core cells can be programmed to any multiple number of target reference program voltages so that each cell can store any number of bits of information.

From the foregoing detailed description, it can thus be seen that the present invention provides an improved programming circuitry for performing a programming operation and a concurrent verify operation in an array of multiple bits-per-cell flash EEPROM memory cells on a more effective and efficient basis. The programming current source circuitry includes a switching circuit for selectively connecting a program current source to the selected certain ones of the columns of array bit lines containing the selected memory core cells which are to be programmed. A sensing logic circuit continuously compares the potential on the selected bit line and a target reference program voltage. The switching circuit disconnects the program current source so as to inhibit further programming when the potential on the selected bit line falls below the target reference program voltage.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An improved programming structure for performing a programming operation and a concurrent verify operation in an array of multiple bits-per-cell flash EEPROM memory cells on a more effective and efficient basis, said programming structure comprising in combination:

a memory core array (12) having a plurality of memory core cells arranged in rows of word lines and columns of bit lines intersecting said rows of word lines, each of said memory core cells including a floating gate array transistor having its control gate connected to one of said rows of word lines, its source connected to one of said columns of bit lines, and its drain connected to a common array ground line;

row decoder means (14) responsive to row address signals and being operatively connected to said memory core array for selecting certain ones of said rows of word lines;

column decoder means (16,20) responsive to column address signals and being operatively connected to said memory core array for selecting certain ones of said columns of bit lines;

reference cell array means (22) including a plurality of reference core cells arranged in rows of word lines corresponding to the number of rows in said memory core array and in columns of reference bit lines corresponding to the number of programmable memory states and which are selected together with the selected memory core cells;

each of said reference core cells including a reference cell transistor having its control gate connected to the same one of said rows of word lines, its source connected to one of the columns of reference bit lines, and its drain connected to the common array ground line;

pre-charging means (36) for initially precharging all of said array bit lines and all of said reference bit lines to a predetermined potential prior to said programming operation;

reference voltage generator means (134) having an output for selectively generating one of a plurality of target memory core cell bit line program-verify voltages, each one corresponding to one of a plurality of programmable memory states;

switching means (36a) for selectively connecting a program current source to the selected certain ones of said columns of bit lines containing the selected memory core cells which are to be programmed;

sensing logic means (26,27) having a first input connected to the output of said reference voltage generator means and having a second input connected to one of the selected certain ones of said columns of bit lines for continuously comparing a potential on the one of the selected bit lines and one of the plurality of target program-verify voltages generated by said reference voltage generator means;

said sensing logic means having an output for generating a logic signal which is switched to a low logic level when said potential on said one of the selected bit lines falls below said selected one of the plurality of target program-verify voltages; and said switching means being responsive to said low logic level for disconnecting said program current source so as to inhibit further programming of said selected memory core cells.

2. An improved programming structure as claimed in claim 1, wherein said verify operation is simultaneously performed during programming of said selected memory core cells by said sensing logic means being switched to the low logic level.

3. An improved programming structure as claimed in claim 2, further comprising second reference voltage generator means (234) having outputs for generating a plurality of target reference cell bit line program-verify voltages, each one corresponding to one of a plurality of reference levels.

4. An improved programming structure as claimed in claim 3, further comprising second switching means (36b) for connecting second program current sources to said columns of reference bit lines at the same time as said selected memory core cells are being programmed.

5. An improved programming structure as claimed in claim 4, further comprising second sensing logic means (26',27') having a first input connected to one of the outputs of said second reference voltage generator means and having a second input connected to a corresponding one of the reference bit lines for comparing a potential on said corresponding one of the reference bit lines and a corresponding one of the plurality of target reference cell bit line program-verify voltages generated by said second reference voltage generator means.

6. An improved programming structure as claimed in claim 5, wherein said second sensing logic means has an output for generating a logic signal which is switched to a low logic level when said potential on said corresponding one of the reference bit lines falls below said corresponding one of the plurality of target reference cell bit line program-verify voltages.

7. An improved programming structure as claimed in claim 6, wherein said second switching means is responsive to said low logic level for disconnecting said second program current sources so as to inhibit further programming of said reference core cells.

8. An improved programming structure as claimed in claim 1, wherein said switching means (36a) is comprised of a pull-up transistor (P1)', a switch transistor (N1), and a current mirror arrangement formed of first and second current mirror transistors (N2, N3), and a current source ($I_S$).

9. An improved programming structure as claimed in claim 8, wherein said first current mirror transistor (N2) has its drain and control gate connected together and to the control gate of said second current mirror transistor (N3) and to control a power supply potential via the current source and its source connected to a ground potential, said second current mirror transistor (N3) having its drain connected to the source of said switch transistor (N1) and its source connected to the ground potential, said pull-up transistor (P1) having its source connected to a program inhibit high voltage (VPROG), its control gate connected to the control gate of said switch transistor (N1) and to the output of said sensing logic means, and its drain connected to the selected bit line.

10. An improved programming structure for performing a programming operation and a concurrent verify operation in an array of two bits-per-cell flash EEPROM memory cells on a more effective and efficient basis, said programming structure comprising in combination:

a memory core array (12) having a plurality of memory core cells arranged in rows of word lines and columns of bit lines intersecting said rows of word lines, each of said memory core cells including a floating gate array transistor having its control gate connected to one of said rows of word lines, its source connected to one of said columns of bit lines, and its drain connected to a common array ground line;

row decoder means (14) responsive to row address signals and being operatively connected to said memory core array for selecting certain ones of said rows of word lines;

column decoder means (16,20) responsive to column address signals and being operatively connected to said memory core array for selecting certain ones of said columns of bit lines;

reference cell array means (22) including a plurality of reference core cells arranged in rows of word lines corresponding to the number of rows in said memory core array and in columns of reference bit lines corresponding to three programmable memory states and which are selected together with the selected memory core cells;

each of said reference core cells including a reference cell transistor having its control gate connected to the same one of said rows of word lines, its source connected to one of the columns of reference bit lines, and its drain connected to the common array ground line;

pre-charging means (36) for initially precharging all of said array bit lines and all of said reference bit lines to a predetermined potential prior to said programming operation;

reference voltage generator means (134) having an output for selectively generating one of three target memory core cell bit line program-verify voltages, each one corresponding to one of the three programmable memory states;

switching means (36a) for selectively connecting a program current source to the selected certain ones of said columns of bit lines containing the selected memory core cells which are to be programmed;

sensing logic means (26,27) having a first input connected to the output of said reference voltage generator means and having a second input connected to one of the selected certain ones of said columns of bit lines for continuously comparing a potential on the one of the selected bit lines and one of the three target program-verify voltages generated by said reference voltage generator means;

said sensing logic means having an output for generating a logic signal which is switched to a low logic level when said potential on said one of the selected bit lines falls below said selected one of the three target program-verify voltages; and said switching means being responsive to said low logic level for disconnecting said program current source so as to inhibit further programming of said selected memory core cells.

11. An improved programming structure as claimed in claim 10, wherein said verify operation is simultaneously performed during programming of said selected memory core cells by said sensing logic means being switched to the low logic level.

12. An improved programming structure as claimed in claim 11, further comprising second reference voltage generator means (234) having outputs for generating three target reference cell bit line program-verify voltages, each one corresponding to one of three reference levels.

13. An improved programming structure as claimed in claim 12, further comprising second switching means (36b) for connecting second program current sources to said columns of reference bit lines at the same time as said selected memory core cells are being programmed.

14. An improved programming structure as claimed in claim 13, further comprising second sensing logic means (26',27') having a first input connected to one of the outputs of said second reference voltage generator means and having a second input connected to a corresponding one of the reference bit lines for comparing a potential on said corresponding one of the reference bit lines and a corresponding one of three target reference cell bit line program-verify voltages generated by said second reference voltage generator means.

15. An improved programming structure as claimed in claim 14, wherein said second sensing logic means has an output for generating a logic signal which is switched to a low logic level when said potential on said corresponding one of the reference bit lines falls below said corresponding one of the three target reference cell bit line program-verify voltages.

16. An improved programming structure as claimed in claim 15, wherein said second switching means is responsive to said low logic level for disconnecting said second program current source so as to inhibit further programming of said reference core cells.

17. An improved programming structure as claimed in claim 10, wherein said switching means (36a) is comprised of a pull-up transistor (P1), a switch transistor (N1), and a current mirror arrangement formed of first and second current mirror transistors (N2, N3), and a current source ($I_s$).

18. An improved programming structure as claimed in claim 17, wherein said first current mirror transistor (N2) has its drain and control gate connected together and to the control gate of said second current mirror transistor (N3) and to a power supply potential via the current source and its source connected to a ground potential, said second current mirror transistor (N3) having its drain connected to the source of said switch transistor (N1) and its source connected to the ground potential, said pull-up transistor (P1) having its source connected to a program inhibit high voltage (VPROG), its control gate connected to the control gate of said switch transistor (N1) and to the output of said sensing logic means, and its drain connected to the selected bit line.

19. A method for performing a programming operation in an array of multiple bits-per-cell flash EEPROM memory cells on a more effective and efficient basis, said method comprising the steps of:

providing a memory core array having a plurality of memory core cells arranged in rows of word lines and columns of bit lines intersecting the rows of word lines;

providing a reference cell array including a plurality of reference core cells arranged in rows of word lines corresponding to the number of rows in the memory core array and in columns of reference bit lines corresponding to the number of programmable memory states and which are selected together with a selected memory core cell;

precharging initially all of the array bit lines and all of the reference bit lines to a predetermined voltage potential prior to said programming operation;

selectively generating one of a plurality of target memory core cell bit line program-verify voltages, each one corresponding to one of a plurality of programmable memory states;

selectively connecting a program current source to the selected certain ones of the columns of array bit lines containing the selected memory core cells which are to be programmed;

disconnecting the program current source so as to inhibit further programming of the selected memory core cells when a potential on the selected bit line falls below the selected one of the plurality of target program-verify voltages;

generating a plurality of target reference cell bit line program-verify voltages, each one corresponding to one of a plurality of reference cell levels; and connecting second program current sources to the reference bit lines at the same time as the memory core cells are being programmed.

20. A method for performing a programming operation as claimed in claim 19, further comprising the step of performing simultaneously a verify operation during programming of the selected memory core cells by disconnecting the program current source when said potential on the selected bit line falls below said selected target program-verify voltage.

* * * * *

UNITED STATES PATENT AND TRADEMARK OFFICE
CERTIFICATE OF CORRECTION

PATENT NO. : 5,712,815
DATED : January 27, 1998
INVENTOR(S) : Colin S. Bill et al.

It is certified that error appears in the above-indentified patent and that said Letters Patent is hereby corrected as shown below:

Column 5, line 25, change "ERR" to -- EVR --.

Signed and Sealed this

Fourteenth Day of April, 1998

*Attest:*

BRUCE LEHMAN

*Attesting Officer*   *Commissioner of Patents and Trademarks*